(12) United States Patent
Dutta et al.

(10) Patent No.: US 11,227,892 B2
(45) Date of Patent: Jan. 18, 2022

(54) MRAM INTEGRATION WITH BEOL INTERCONNECT INCLUDING TOP VIA

(71) Applicant: INTERNATIONAL BUSINESS MACHINES CORPORATION, Armonk, NY (US)

(72) Inventors: Ashim Dutta, Menands, NY (US); Chih-Chao Yang, Glenmont, NY (US); Ekmini A. De Silva, Slingerlands, NY (US); Dominik Metzler, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 16/443,934

(22) Filed: Jun. 18, 2019

(65) Prior Publication Data

US 2020/0403032 A1    Dec. 24, 2020

(51) Int. Cl.
*H01L 43/12* (2006.01)
*H01L 27/22* (2006.01)
*H01L 43/02* (2006.01)

(52) U.S. Cl.
CPC ............ *H01L 27/222* (2013.01); *H01L 43/02* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 9,356,231 B2 | 5/2016 | Sung et al. | |
| 9,614,143 B2 | 4/2017 | Lu et al. | |
| 9,741,929 B2 | 8/2017 | Guo | |
| 9,935,261 B1 | 4/2018 | Patel et al. | |
| 10,008,662 B2 | 6/2018 | You et al. | |
| 10,243,138 B2 | 3/2019 | Annunziata et al. | |
| 2008/0198647 A1* | 8/2008 | Kanakasabapathy | ... H01L 43/12 365/171 |
| 2012/0032287 A1* | 2/2012 | Li | ............. H01L 43/12 257/421 |
| 2015/0318333 A1 | 11/2015 | Narayanan et al. | |
| 2015/0325622 A1* | 11/2015 | Zhang | ...... H01L 43/08 257/421 |

(Continued)

OTHER PUBLICATIONS

Paolillo et al., "Direct metal etch of ruthenium for advanced interconnect", Journal of Vacuum Science & Technology B. vol. 36, No. 3. May 2, 2018. pp. 1-9.

(Continued)

*Primary Examiner* — Benjamin P Sandvik
(74) *Attorney, Agent, or Firm* — Tutunjian & Bitetto, P.C.; L. Jeffrey Kelly (57) ABSTRACT

A method is presented for preventing excessive cap dielectric loss in memory areas and logic areas of a device. The method includes forming a first conductive line with top via and a conductive pad over a dielectric layer, wherein the conductive pad includes a microstud, depositing a dielectric cap in direct contact with the first conductive line and the conductive pad, and constructing a top electrode, a magnetic tunnel junction (MTJ) stack, and a bottom electrode in vertical alignment with the microstud of the conductive pad.

16 Claims, 9 Drawing Sheets

(56) References Cited

U.S. PATENT DOCUMENTS

| | | | | |
|---|---|---|---|---|
| 2016/0027738 A1* | 1/2016 | Murray | ............ | H01L 23/53223 |
| | | | | 257/751 |
| 2018/0159023 A1* | 6/2018 | Suh | ........... | H01L 43/08 |
| 2018/0350875 A1* | 12/2018 | Han | ............ | H01L 27/228 |
| 2020/0136014 A1* | 4/2020 | Wang | ............ | H01F 10/3254 |
| 2020/0328251 A1* | 10/2020 | Dutta | ............ | H01L 23/53209 |

OTHER PUBLICATIONS

Xue et al., "A Self-Aligned Two-Step Reactive Ion Etching Process for Nanopatterning Magnetic Tunnel Junctions on 300 mm Wafers", IEEE Transactions on Magnetics. vol. 50, No. 11. Nov. 18, 2014. pp. 1-3.

* cited by examiner

FIG. 12

MRAM INTEGRATION WITH BEOL INTERCONNECT INCLUDING TOP VIA

BACKGROUND

The present invention relates generally to semiconductor devices, and more specifically, to embedded magnetoresistive random access memory (MRAM) integration with a back end-of-the-line (BEOL) interconnect structure including a top via.

Unlike conventional random access memory (RAM) chip technologies, magnetic RAM (MRAM) does not store data as electric charge, but instead stores data by magnetic polarization of storage elements. Usually, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (e.g., anti-parallel polarity to the fixed layer) or "0" (e.g., parallel polarity to the fixed layer). One device having a fixed layer, a tunneling layer, and a free layer is a magnetic tunnel junction (MTJ).

SUMMARY

In accordance with an embodiment, a method is provided for preventing excessive cap dielectric loss in memory areas and logic areas of a semiconductor structure. The method includes forming a first conductive line with top via and a conductive pad over a dielectric layer, wherein the conductive pad includes a microstud, depositing a dielectric cap in direct contact with the first conductive line and the conductive pad, and constructing a top electrode, a magnetic tunnel junction (MTJ) stack, and a bottom electrode in vertical alignment with the microstud of the conductive pad.

In accordance with another embodiment, a method is provided for reducing gouging of a dielectric cap by employing a top via formed using subtractive etch technique. The method includes forming a first conductive line in a logic area of a device, forming a conductive pad in a memory area of the device, constructing MRAM pillars in the memory area, wherein the MRAM pillars are in direct contact with a microstud of the conductive pad, encapsulating the MRAM pillars with an encapsulation layer, recessing the encapsulation layer to expose an upper area of the MRAM pillars, and forming metal lines with vias to the top section of the MRAM pillars and to a top surface of the first conductive line.

In accordance with yet another embodiment, a semiconductor device is provided for reducing gouging of a dielectric cap by employing a subtractive etch technique. The semiconductor device includes a first conductive line with top via in a logic area of a device, a conductive pad with microstud in a memory area of the device, MRAM pillars constructed in the memory area, wherein the MRAM pillars are in direct contact with a micro stud of the conductive pad, an encapsulation layer for encapsulating the MRAM pillars such that an upper area of the MRAM pillars is exposed, and metal lines with vias extending to the exposed upper area of the MRAM pillars and to a top surface of the first conductive line.

It should be noted that the exemplary embodiments are described with reference to different subject-matters. In particular, some embodiments are described with reference to method type claims whereas other embodiments have been described with reference to apparatus type claims.

However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing an embedded magnetoresistive random access memory (MRAM) device with a top via scheme by subtractive etching. In embedded MRAM devices, gouging underneath the bottom electrode occurs during ion beam etching (IBE) of the magnetic tunnel junction (MTJ) stack. This process can remove all of the dielectric cap layer in both the memory areas and the logic areas, thus exposing the conductive lines of interconnect levels below. In conventional approaches, the bottom electrode contact (BEC) dielectric needs to be increased. However, a thickness of the BEC dielectric cannot be increased arbitrarily. Additionally, conventional approaches need a high aspect ratio contact etch and fill in the logic area of a device, which can pose further limitations.

Embodiments in accordance with the present invention prevent excessive cap dielectric loss during MRAM device patterning by providing methods and devices for constructing an MRAM by subtractive etching (instead of a damascene process), where the BEC dielectric can be increased. Employing a top via in the logic area allows for the reduction of the aspect ratio for the logic contact. Further, this allows for making the memory top contact through the via since a via depth difference between the memory area and the logic area won't be large. Therefore, a subtractive top via to damascene via connection is employed, where the cap dielectric on top of the metal line in both the logic areas and the memory areas is preserved. Stated differently, the methods and devices of the present invention employ an integration scheme for logic area interconnection formation while embedding an MRAM device. As a result, excessive cap dielectric loss during MRAM device patterning can be prevented.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
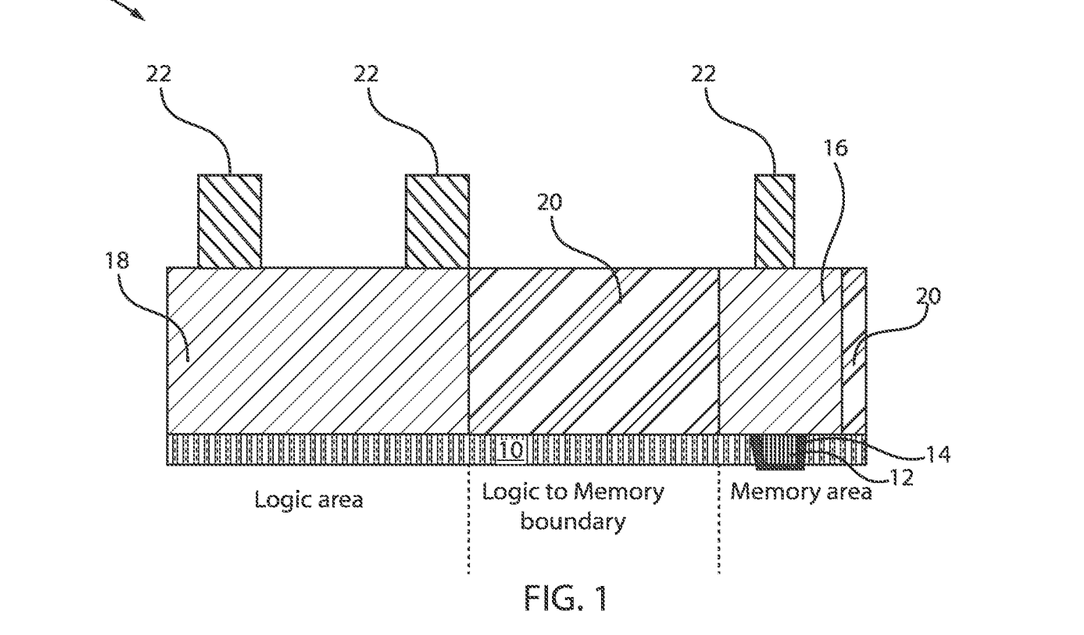
FIG. 1 is a cross-sectional view of a semiconductor structure including metal lines formed over a conductive line and over a conductive pad, in accordance with an embodiment of the present invention.

FIG. 1 is a cross-sectional view of a semiconductor structure including metal lines formed over a conductive line and over a conductive pad, in accordance with an embodiment of the present invention.

The semiconductor structure 5 includes at least one conductive line 12 formed within an inter-layer dielectric (ILD) 10. A liner 14, such as a tantalum nitride (TaN) liner 14 or in the alternative a tantalum (Ta) liner 14 is deposited over or around the trenches. In one example embodiment, the conductive fill material 14 can be deposited, for example, by electroplating, electroless plating, chemical vapor deposition (CVD), atomic layer deposition (ALD) and/or physical vapor deposition (PVD). The conductive line 12 is formed within the liner 14.

A conductive pad 16 and a conductive line 18 can be formed over the ILD 10. The conductive pad 16 directly contacts the conductive line 12. The conductive pad 16 is separated from the conductive line 18 by a dielectric 20. The dielectric 20 can be, e.g., an ultra-low-k dielectric. A via pattern 22 is then formed over the conductive pad 16 and the conductive line 18 using a lithography process. Via pattern 22 can use a bilayer (photoresist, and antireflection coating) or a tri-layer (photoresist, antireflection coating and organic planarizing material) or any other combination of lithographic patterning stack.

Moreover, the structure 5 can be defined within, e.g., three regions. The first region can designate a logic area, the second region can designate a logic to memory boundary, and the third region can designate a memory region. Alignment marks are used to align the wafer such that subsequent layers are formed at the correct location relative to underlying features. For example, alignment marks can be used to form the vias and conductive lines in the metallization layers in the correct location to make electrical contact to the devices, such as transistors, formed in the underlying substrate.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from, e.g., about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal line 12 can be formed in the openings or trenches formed in the ILD 10. The metal line 12 can be any conductive material known in the art, such as, for example, copper (Cu), aluminum (Al), Cobalt (Co), Ruthenium (Ru), or tungsten (W). The metal line 12 can be fabricated using any technique known in the art, such as, for example, a single or dual damascene technique. In an embodiment, not illustrated, the metal line 12 can be copper (Cu) and can include a metal liner 14, where a metal liner can be metals, such as, for example, tantalum nitride and tantalum (TaN/Ta), titanium, titanium nitride, cobalt, ruthenium, and manganese.

The conductive pad 16 and the conductive line 18 can be formed from metals including aluminum (Al), tungsten (W), titanium (Ti), ruthenium (Ru) or any combination thereof. The metals 16, 18 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In one example, the conductive pad 16 and the conductive line 18 are formed from the same material. The same material can be ruthenium. Regarding ruthenium, ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means Ru will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals. Ruthenium plating is also used when manufacturing semiconductors.

Ruthenium has drawn substantial interest because Ru can serve as both barrier and seed layers, minimizing the amount of high resistance material needed in semiconductor circuits. As linewidths shrink below 15 nm, though, even a 1 or 2 nanometer barrier layer can be too much. As line volume shrinks, the resistance of copper (Cu) rises sharply due to electron scattering from sidewalls and grain boundaries. Increasing resistance adds to overall circuit delays and also contributes to electromigration. As a refractory metal, ruthenium has a very high melting point (above 2300° C.) and good electromigration resistance, and can alleviate such issues.

Figure 2:
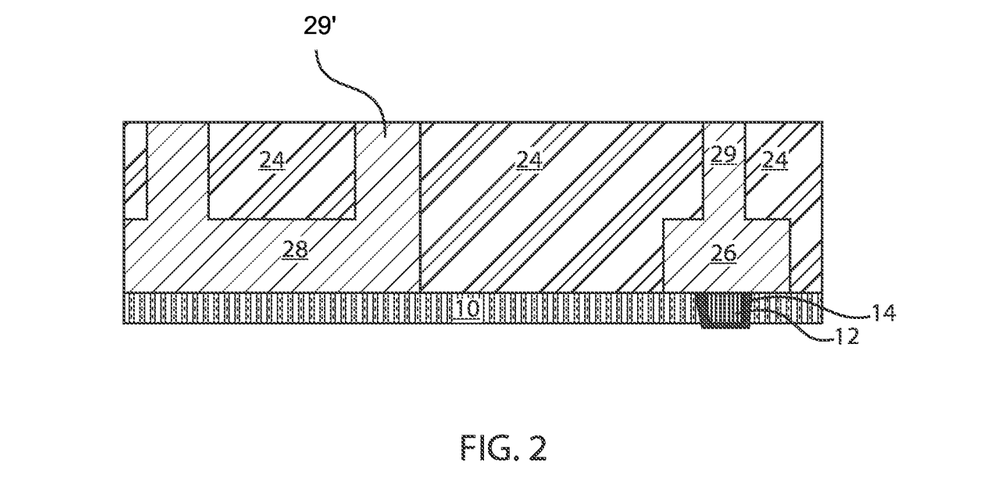
FIG. 2 is a cross-sectional view of the semiconductor structure of FIG. 1 where the metal lines are recessed, the conductive line and conductive pad are etched, an inter-layer dielectric (ILD) is deposited and reduced by chemical-mechanical polishing (CMP), in accordance with an embodiment of the present invention.

FIG. 2 is a cross-sectional view of the semiconductor structure of FIG. 1 where the metal lines are recessed, the conductive line and conductive pad are etched, an inter-layer dielectric (ILD) is deposited and reduced by chemical-mechanical polishing (CMP), in accordance with an embodiment of the present invention.

In various exemplary embodiments, the conductive pad 16 and conductive line 18 are etched using lithographic pattern 22, an inter-layer dielectric (ILD) 24 is deposited and reduced by chemical-mechanical polishing (CMP). The etching of the conductive pad 16 and conductive line 18 results in a conductive line portion 28 with top via 29' and conductive pad 26 with a conducting microstud 29. The conductive line portion 28 can have a substantially U-shaped configuration, whereas the conductive pad areas 26, 29 can define a substantially inverted T-shaped configuration. The conductive pad 26 directly contacts the conductive line 12. The conducting microstud 29 can be referred to as a microstud or protrusion or extension (region or section or portion).

Figure 3:
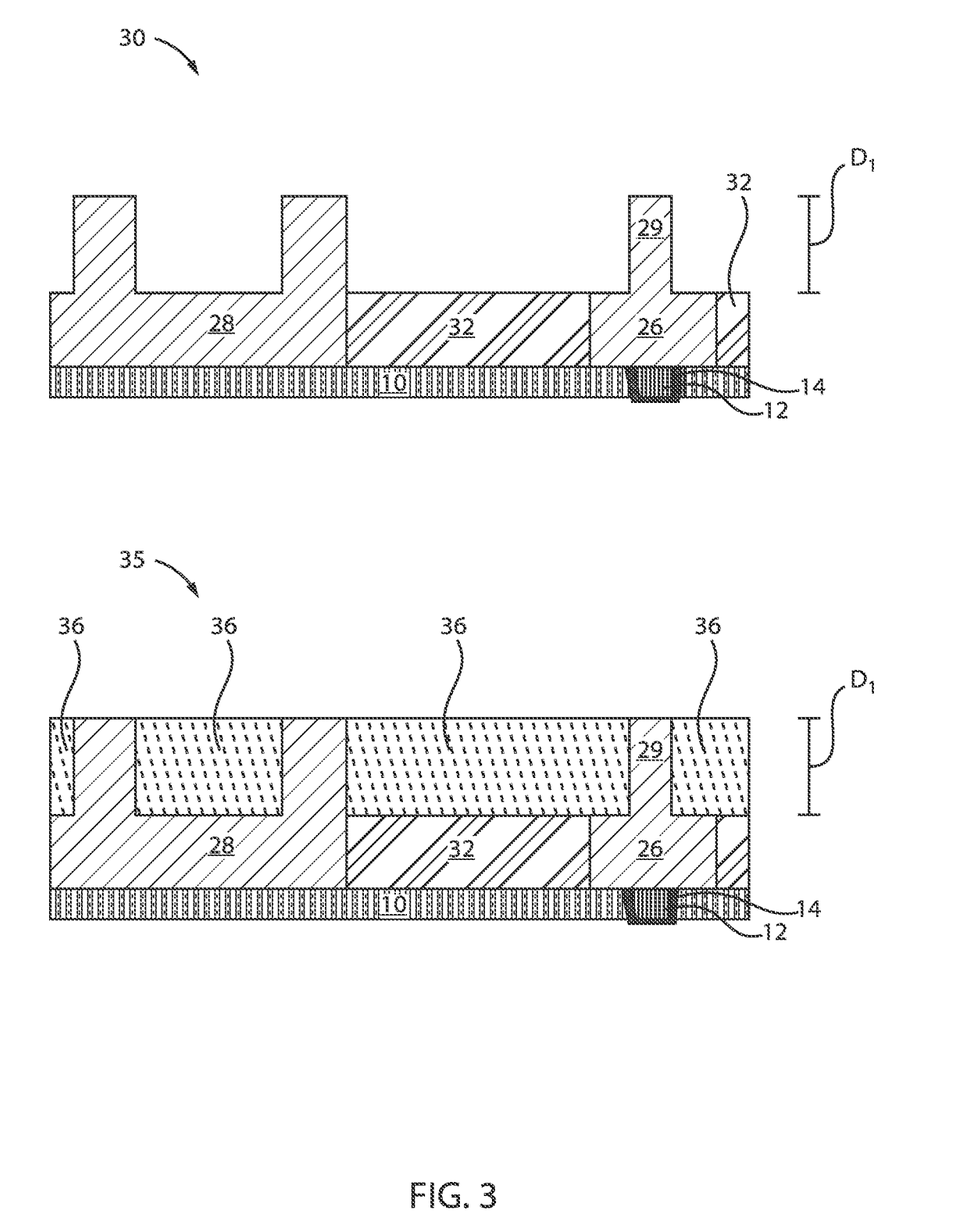
FIG. 3 is a cross-sectional view of the semiconductor structure of FIG. 2 where the ILD is recessed to expose a microstud of the conductive pad and a dielectric cap is deposited, in accordance with an embodiment of the present invention.

FIG. 3 is a cross-sectional view of the semiconductor structure of FIG. 2 where the ILD is recessed to expose the conducting microstud 29 of the conductive pad as well as the top via 29' and a dielectric cap is deposited, in accordance with an embodiment of the present invention.

In various exemplary embodiments, in structure 30, the ILD 24 is recessed to expose top via 29' along with top portions of the conductive line 28 and to expose the conducting microstud 29 of the conductive pad 26. The conducting microstud 29 can extend a distance "$D_1$" above the conductive pad 26. The remaining ILD can be designated as 32. The conducting microstud 29 is vertically aligned with the conductive line 12. The conducting microstud 29 can have a thickness approximately equal to the thickness of the conductive line 12.

In various exemplary embodiments, in structure 35, a dielectric cap 36 is deposited. In one example, the dielectric cap 36 can be, e.g., a hydrogenated silicon carbonitride film (SiCN:H). The dielectric cap 36 can be reduced by CMP such that a top surface of the dielectric cap is flush or level with a top surface of the conducting microstud 29 and top via 29'. The dielectric cap 36 can be referred to as a barrier layer, and can be formed from NBLOK. NBLOK, is engineered as an alternative to silicon nitride films. NBLOK is designed to reduce the dielectric constant (k) of copper damascene structures in order to achieve faster, more powerful devices. With a dielectric constant of less than 5, the NBLOK offers up to twice the etch selectivity of SiN, demonstrates leakage that is six to seven orders of magnitude better than conventional silicon carbide (SiC) material, and features good adhesion to other films.

Figure 4:
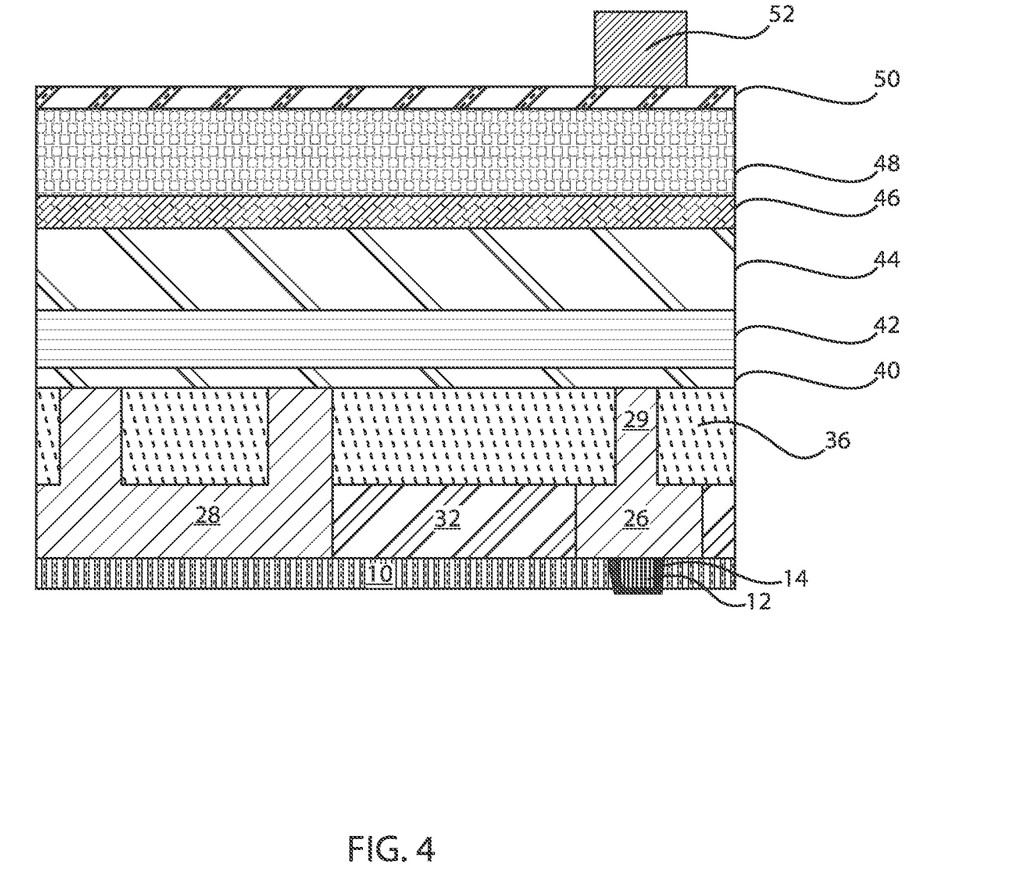
FIG. 4 is a cross-sectional view of the semiconductor structure of FIG. 3 where a bottom electrode, a magnetic tunnel junction (MTJ), a top electrode, a dielectric layer, an organic planarization layer (OPL), an anti-reflective coating (ARC) layer, and a photoresist are deposited over the conductive line and the conductive pad, in accordance with an embodiment of the present invention.

FIG. 4 is a cross-sectional view of the semiconductor structure of FIG. 3 where a bottom electrode, a magnetic tunnel junction (MTJ) stack, a top electrode, a dielectric layer, an organic planarization layer (OPL), an anti-reflective coating (ARC) layer, and a photoresist are deposited over conducting microstud 29, top via 29' and dielectric cap 36, in accordance with an embodiment of the present invention.

In various exemplary embodiments, a bottom electrode 40, a magnetic tunnel junction (MTJ) stack or MTJ 42, a top electrode 44, a dielectric layer 46, an organic planarization layer (OPL) 48, an anti-reflective coating (ARC) layer 50, and a photoresist 52 are deposited over the conductive line portion 28 and the conductive pad areas 26, 29.

The bottom electrode 40 can include a conductive material, such as Cu, Al, Ag, Au, Pt, etc. In some embodiments, the bottom electrode 40 can include nitrides such as TiN, TaN, Ta, Ti, W, or Ru.

The MTJ 42 includes two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as, e.g., a memory cell in a nonvolatile magnetic random access memory (MRAM) array, and as, e.g., a magnetic field sensor, such as a magnetoresistive read head in a magnetic recording disk drive.

MRAM is a type of solid state memory that uses tunneling magnetoresistance (TMR) to store information. MRAM is made up of an electrically connected array of magnetoresistive memory elements, referred to as magnetic tunnel junctions (MTJs). Each MTJ includes a free layer having a magnetization direction that is variable, and a fixed layer having a magnetization direction that is invariable. The free layer and fixed layer each include a layer of a magnetic material, and are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is antiparallel to the magnetization direction of the fixed layer, the MTJ is in a high resistance state. The difference in resistance of the MTJ can be used to indicate a logical '1' or '0', thereby storing a bit of information.

The top electrode 44 can include a conductive material, such as Cu, Al, Ag, Au, Pt, etc. In some embodiments, the top electrode 44 can include nitrides such as TiN, TaN, Ta, Ti, W, or Ru.

The dielectric layer 46 can be, e.g., an oxide. The dielectric layer 46 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The OPL 48 and the ARC layer 50 can be employed as a lithographic stack to pattern the underlying layers. The OPL 48 is formed at a predetermined thickness to provide reflectivity and topography control during etching of the hard mask layers below. The OPL 48 can include an organic material, such as a polymer. The thickness of the OPL 48 can be in a range from about 50 nm to about 300 nm.

The layer 50 is an ARC layer which minimizes the light reflection during lithography for a lithography stack. The ARC layer 50 can include silicon, for example, a silicon anti-reflective layer (SiARC). The thickness of the ARC layer 50 can be in range from about 10 nm to about 100 nm. The anti-reflective film layer 50 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 52 (e.g., a material that will react when exposed to light), and then selectively exposing portions of the photoresist 52 to light or other ionizing radiation (e.g., ultraviolet, electron beams, X-rays, etc.), thereby changing the solubility of portions of the material. The resist 52 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 5:
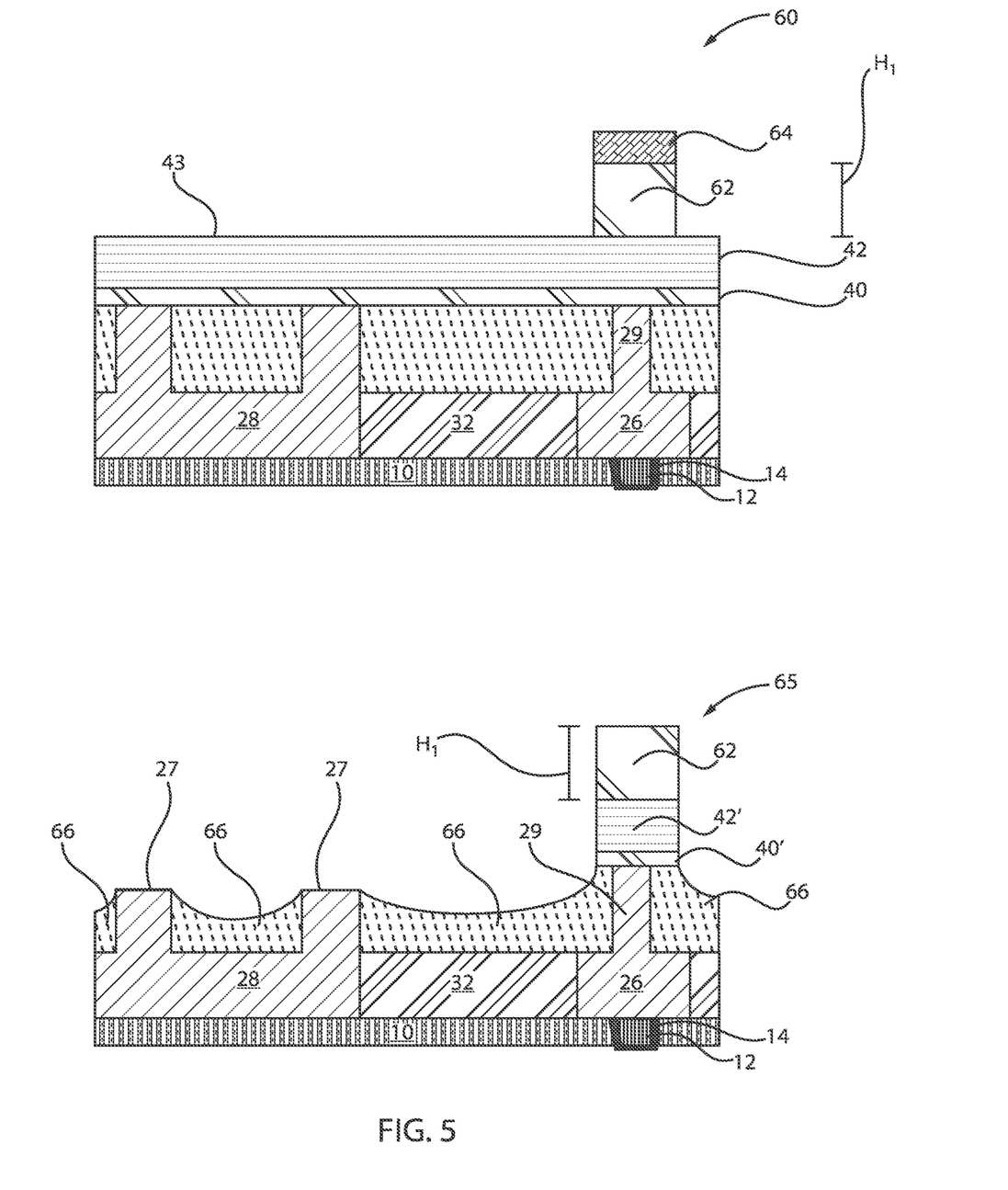
FIG. 5 is a cross-sectional view of the semiconductor structure of FIG. 4 where the OPL, the ARC layer, and the photoresist are removed such that a top electrode portion remains aligned with the microstud of the conductive pad, in accordance with an embodiment of the present invention.

FIG. 5 is a cross-sectional view of the semiconductor structure of FIG. 4 where the OPL, the ARC layer, and the photoresist are removed such that a top electrode portion remains aligned with the microstud of the conductive pad, in accordance with an embodiment of the present invention.

In various exemplary embodiments, in structure 60, the OPL 48, the ARC layer 50, and the photoresist 52 are removed such that a top electrode portion 62 remains aligned with the microstud 29 of the conductive pad 26. Additionally, a dielectric portion 64 remains over the top electrode portion 62. The etch extends to a top surface 43 of the MTJ 42. The top electrode portion 62 has a height $H_1$. The height $H_1$ can be, e.g., about 20 to about 200 nm.

In various exemplary embodiments, in structure 65, a further etch is performed. The etch can be accomplished by reactive ion etch (RIE) or ion beam etch (IBE). The second etch results in removal of the dielectric portion 64 and a portion of the top electrode portion 62. The second etch also results in the removal of the MTJ 42 and the bottom electrode 40, such that a bottom electrode portion 40' and a MTJ portion 42' remain in alignment with the top electrode portion 62. The top electrode portion 62, the MTJ portion 42', and the bottom electrode portion 40' are aligned with the microstud 29, which in turn is aligned with the conductive line 12. The bottom electrode portion 40' directly contacts a top surface of the microstud 29. The width of the top electrode portion 62, the MTJ portion 42', and the bottom electrode portion 40' is greater than the width of the microstud 29.

Additionally, the dielectric cap 36 is etched such that dielectric cap regions 66 remain. The second etch also results in the exposure of the top surface 27 of top via 29' above the conductive line portion 28. In other words, the distal ends or surfaces 27 of the of top via 29' above conductive line portion 28 are exposed. The dielectric cap regions 66 are not completely gouged. Instead, the dielectric cap regions 66 are slightly recessed by the second etch to prevent excessive cap dielectric loss during MRAM device patterning.

Figure 6:
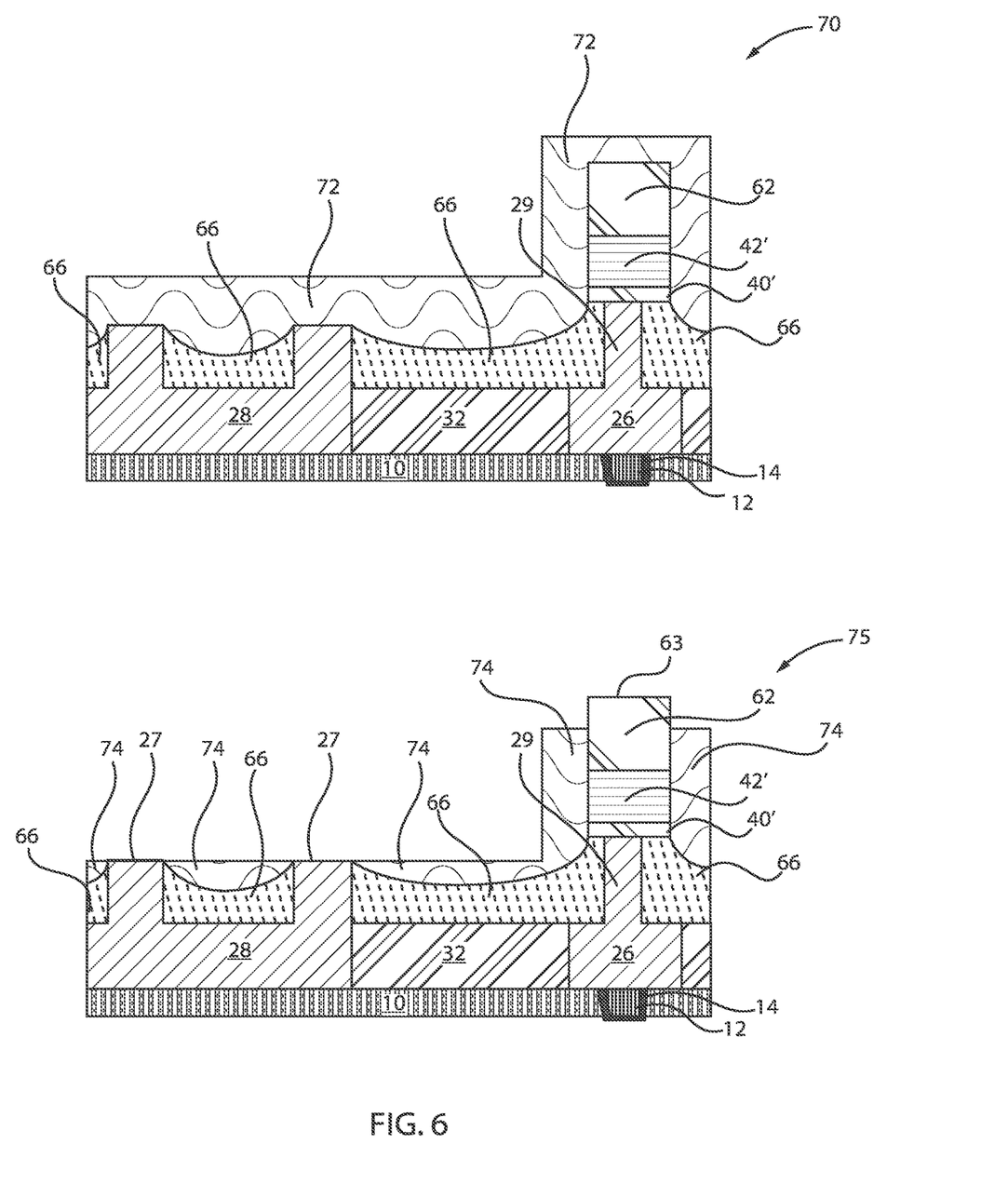
FIG. 6 is a cross-sectional view of the semiconductor structure of FIG. 5 where an encapsulation layer is deposited and recessed to expose a top portion of the top electrode, in accordance with an embodiment of the present invention.

FIG. 6 is a cross-sectional view of the semiconductor structure of FIG. 5 where an encapsulation layer is deposited and recessed to expose a top portion of the top electrode, in accordance with an embodiment of the present invention.

In various exemplary embodiments, in structure 70, an encapsulation layer 72 is deposited. The encapsulation layer 72 can be, e.g., a silicon nitride (SiN) layer. The encapsulation layer 72 encapsulates or surrounds the top electrode portion 62, the MTJ portion 42', and the bottom electrode portion 40'. The encapsulation layer 72 directly contacts the top surface 27 of the of top via 29' above conductive line portion 28. The encapsulation layer 72 does not contact the microstud 29.

In various exemplary embodiments, in structure 75, the encapsulation layer 72 is etched such that a top surface 63 and an upper section of the top electrode portion 62 is exposed. The remaining encapsulation regions are designated as 74. The etch results in the exposure of the top surface 27 of the conductive line portion 28.

Figure 7:
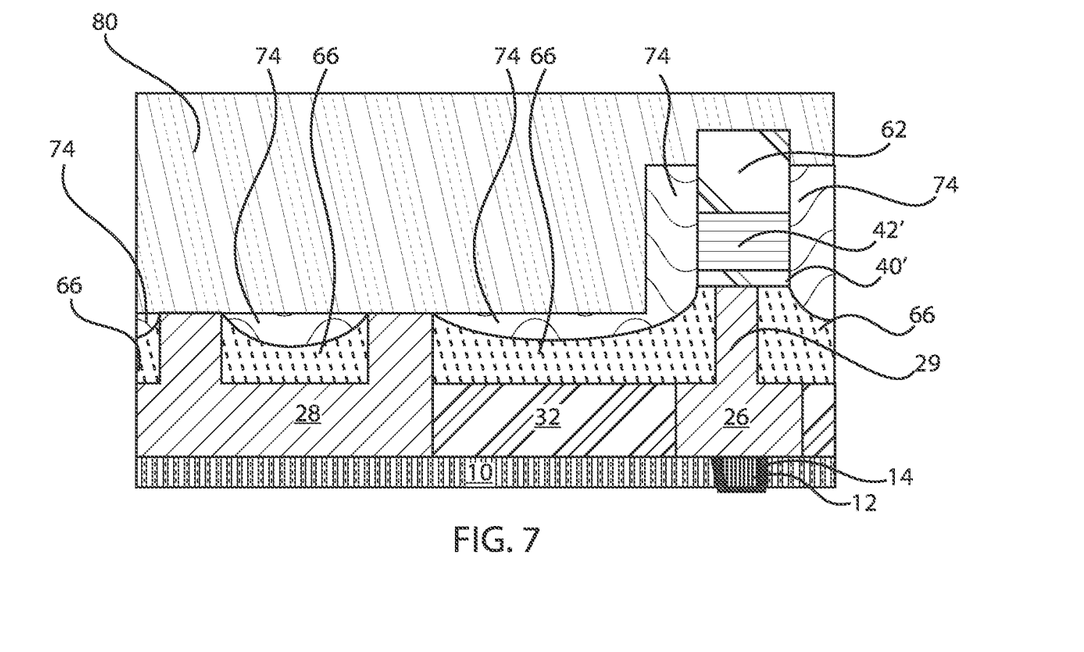
FIG. 7 is a cross-sectional view of the semiconductor structure of FIG. 6 where an ILD layer is deposited, in accordance with an embodiment of the present invention.

FIG. 7 is a cross-sectional view of the semiconductor structure of FIG. 6 where an ILD layer is deposited, in accordance with an embodiment of the present invention.

In various example embodiments, a low-k dielectric layer 80 is deposited. A low-k dielectric material as used in the low-k dielectric layer 80 can have a dielectric constant that is less than 4.0, e.g., 3.9. In one embodiment, the low-k material layer 80 can have a dielectric constant ranging from about 1.0 to about 3.5. In another embodiment, the low-k material layer 80 can have a dielectric constant ranging from about 1.75 to about 3.2.

One example of a material suitable for the low-k materials for the low-k dielectric layer 80 can include silicon oxycarbonitride (SiOCN). Other low-k materials that can also be used for the low-k dielectric layer 80 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 80 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed. In some embodiments, the low-k dielectric layer 80 can have a thickness ranging from about 50 nm to about 500 nm.

Figure 8:
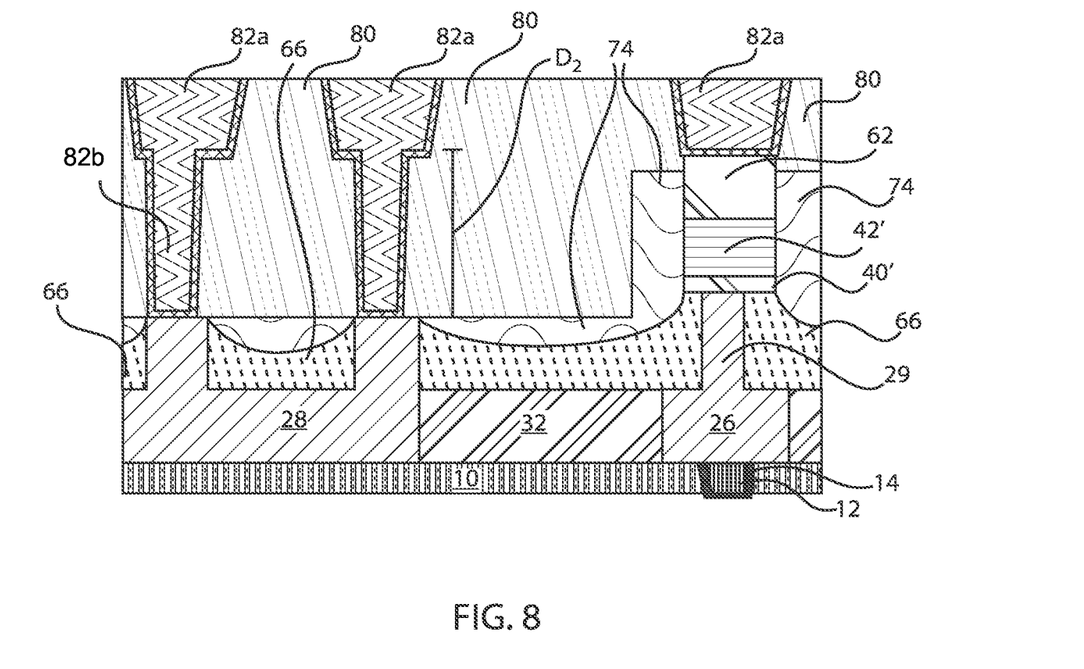
FIG. 8 is a cross-sectional view of the semiconductor structure of FIG. 7 where metal contacts are formed in direct contact with the conductive line and over the conductive pad, in accordance with an embodiment of the present invention.

FIG. 8 is a cross-sectional view of the semiconductor structure of FIG. 7 where metal contacts are formed in direct contact with the conductive line and over the conductive pad, in accordance with an embodiment of the present invention.

In various example embodiments, metal line 82a and vias 82b are formed using conventional dual damascene process. In the logic region, vias extend from the bottom of metal line 82a to the top surface 27 of the top via 29' above conductive line portion 28 and in the memory region, the metal line extends to the top surface 63 of the top electrode portion 62. The metal lines 82a and vias 82b are then filled with a conductive material 82. A distance between the top surface 27 of top via 29' above the conductive line portion 28 and the top of the vias 82a is designated as "$D_2$." The top electrode 62, the MTJ portion 42', and the bottom electrode portion 40' can be collectively referred to as an MRAM pillar. The MRAM pillar is formed in the memory area of the device.

The conductive material 82 can include copper (Cu), cobalt (Co), aluminum (Al), platinum (Pt), gold (Au), tungsten (W), titanium (Ti), or any combination thereof. The metal 82 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 82 can be reduced by CMP and/or etching. Therefore, the planarization process can be provided by CMP. Other planarization process can include grinding and polishing.

Figure 9:
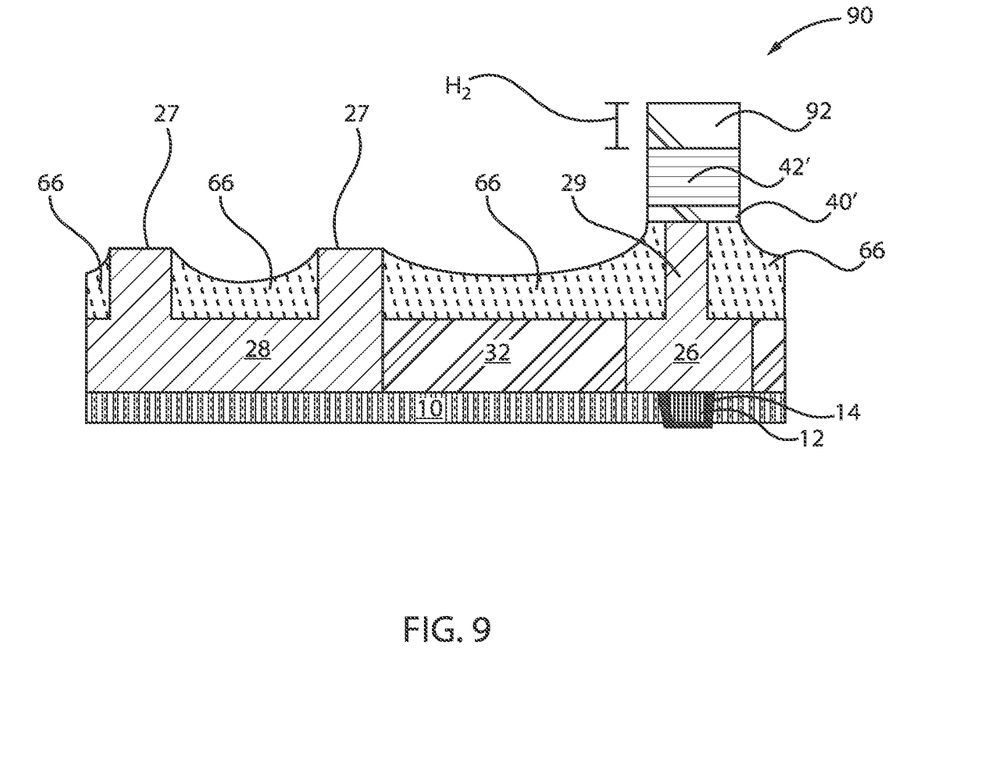
FIG. 9 is a cross-sectional view of the semiconductor structure of FIG. 4 where the OPL, the ARC layer, and the photoresist are removed such that a top electrode portion remains aligned with the microstud of the conductive pad, the top electrode portion being thinner than the top electrode portion of FIG. 5, in accordance with another embodiment of the present invention.

FIG. 9 is a cross-sectional view of the semiconductor structure of FIG. 4 where the OPL, the ARC layer, and the photoresist are removed such that a top electrode portion remains aligned with the microstud of the conductive pad, the top electrode portion being thinner than the top electrode portion of FIG. 5, in accordance with another embodiment of the present invention.

In various example embodiments, as in FIG. 5, in structure 90, the OPL 48, the ARC layer 50, and the photoresist 52 are removed such that a top electrode portion 92 remains aligned with the microstud 29 of the conductive pad 26. Additionally, the dielectric portion 64 remains over the top electrode portion 62. The ion beam etch extends to a top surface 93 of the MTJ 42. The top electrode portion 92 has a height $H_2$. The height $H_2$ can be, e.g., about 20 to about 150 nm. The height $H_2$ or thickness of the top electrode portion 92 is less than the height $H_1$ or thickness of the top electrode portion 62 of FIG. 5. Therefore, the top electrode portion 92 is much thinner than the top electrode portion 62 of FIG. 5.

In various exemplary embodiments, in structure 90, a further etch is performed. The etch can be accomplished by reactive ion etch (RIE) or ion beam etch (IBE). The second etch results in removal of the dielectric portion 64 and a portion of the top electrode portion 92. The second etch also results in the removal of the MTJ 42 and the bottom electrode 40, such that a bottom electrode portion 40' and a MTJ portion 42' remain in alignment with the top electrode portion 92. The top electrode portion 92, the MTJ portion 42', and the bottom electrode portion 40' are aligned with the microstud 29, which in turn is aligned with the conductive line 12. The bottom electrode portion 40' directly contacts a top surface of the microstud 29. The width of the top electrode portion 92, the MTJ portion 42', and the bottom electrode portion 40' is greater than the width of the microstud 29.

Additionally, the dielectric cap 36 is etched such that dielectric cap regions 66 remain. The second etch also results in the exposure of the top surface 27 of top via 29' above the conductive line portion 28. In other words, the distal ends or surfaces 27 of the top via 29' above conductive line portion 28 are exposed.

Figure 10:
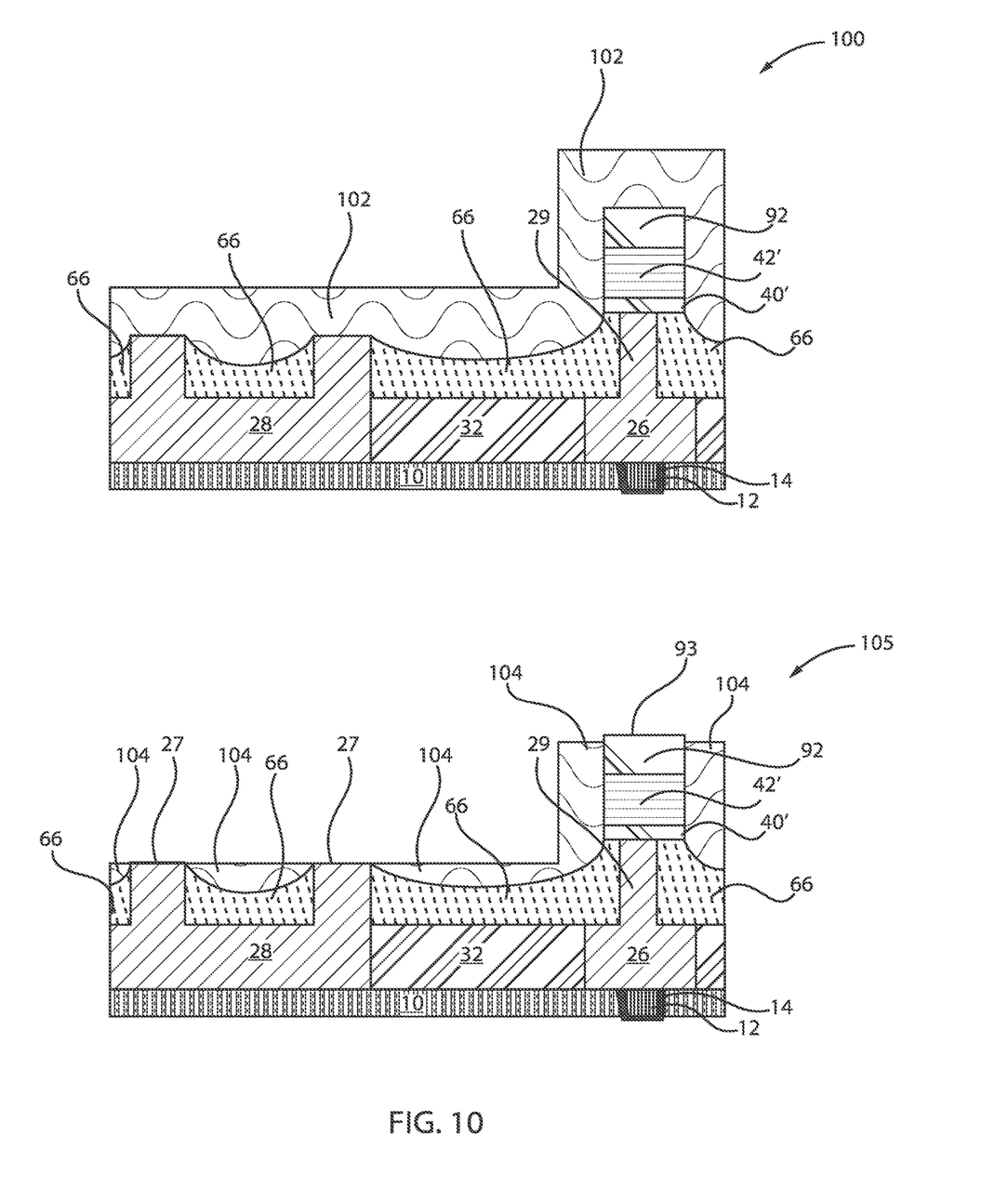
FIG. 10 is a cross-sectional view of the semiconductor structure of FIG. 9 where an encapsulation layer is deposited and recessed to expose a top portion of the top electrode, in accordance with an embodiment of the present invention.

FIG. 10 is a cross-sectional view of the semiconductor structure of FIG. 9 where an encapsulation layer is deposited and recessed to expose a top portion of the top electrode, in accordance with an embodiment of the present invention.

In various exemplary embodiments, in structure 100, an encapsulation layer 102 is deposited. The encapsulation layer 102 can be, e.g., a silicon nitride (SiN) layer. The encapsulation layer 102 encapsulates or surrounds the top electrode portion 92, the MTJ portion 42', and the bottom electrode portion 40'. The encapsulation layer 102 directly contacts the top surface 27 of the top via 29' above conductive line portion 28. The encapsulation layer 102 does not contact the microstud 29.

In various exemplary embodiments, in structure 105, the encapsulation layer 102 is etched such that a top surface 93 and an upper section of the top electrode portion 92 is exposed. The remaining encapsulation regions are designated as 104. The etch results in the exposure of the top surface 27 of the top via 29' above conductive line portion 28.

Figure 11:
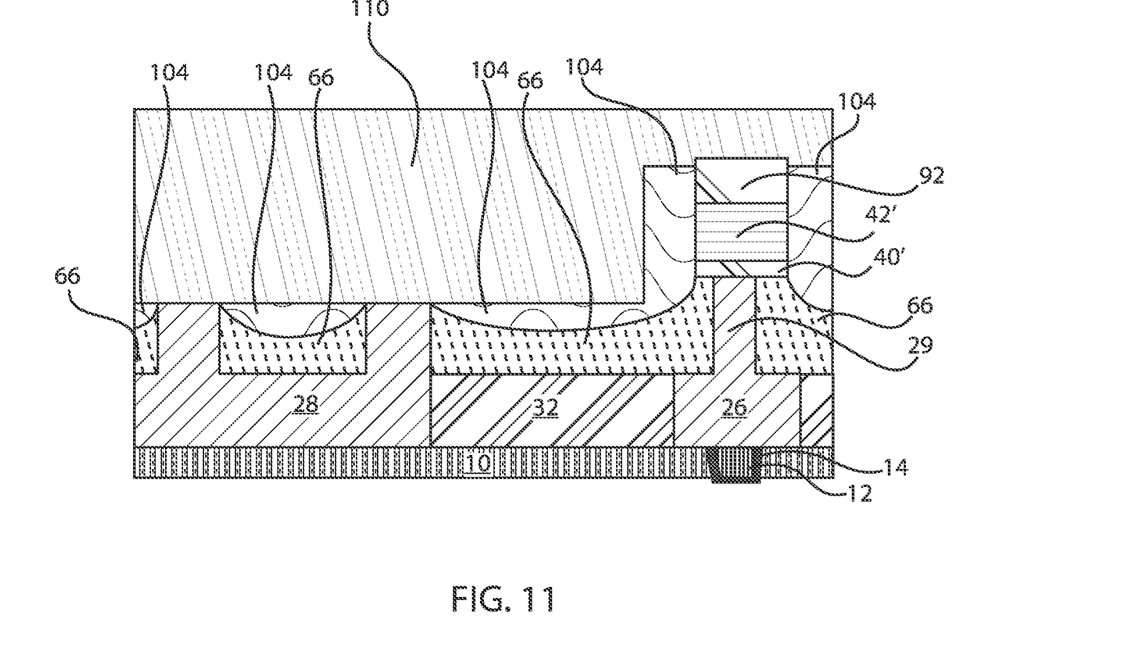
FIG. 11 is a cross-sectional view of the semiconductor structure of FIG. 10 where an ILD layer is deposited, in accordance with an embodiment of the present invention.

FIG. 11 is a cross-sectional view of the semiconductor structure of FIG. 10 where an ILD layer is deposited, in accordance with an embodiment of the present invention.

In various example embodiments, a low-k dielectric layer 110 is deposited. A low-k dielectric material as used in the low-k dielectric layer 110 can have a dielectric constant that is less than 4.0, e.g., 3.9. In one embodiment, the low-k material layer 110 can have a dielectric constant ranging from about 1.0 to about 3.5. In another embodiment, the low-k material layer 100 can have a dielectric constant ranging from about 1.75 to about 3.2.

In some embodiments, the low-k dielectric layer 110 can be conformally deposited using CVD. Variations of CVD processes suitable for forming the first dielectric layer include, but are not limited to, APCVD, LPCVD, PECVD, MOCVD and combinations thereof can also be employed. In some embodiments, the low-k dielectric layer 110 can have a thickness ranging from about 50 nm to about 500 nm.

Figure 12:
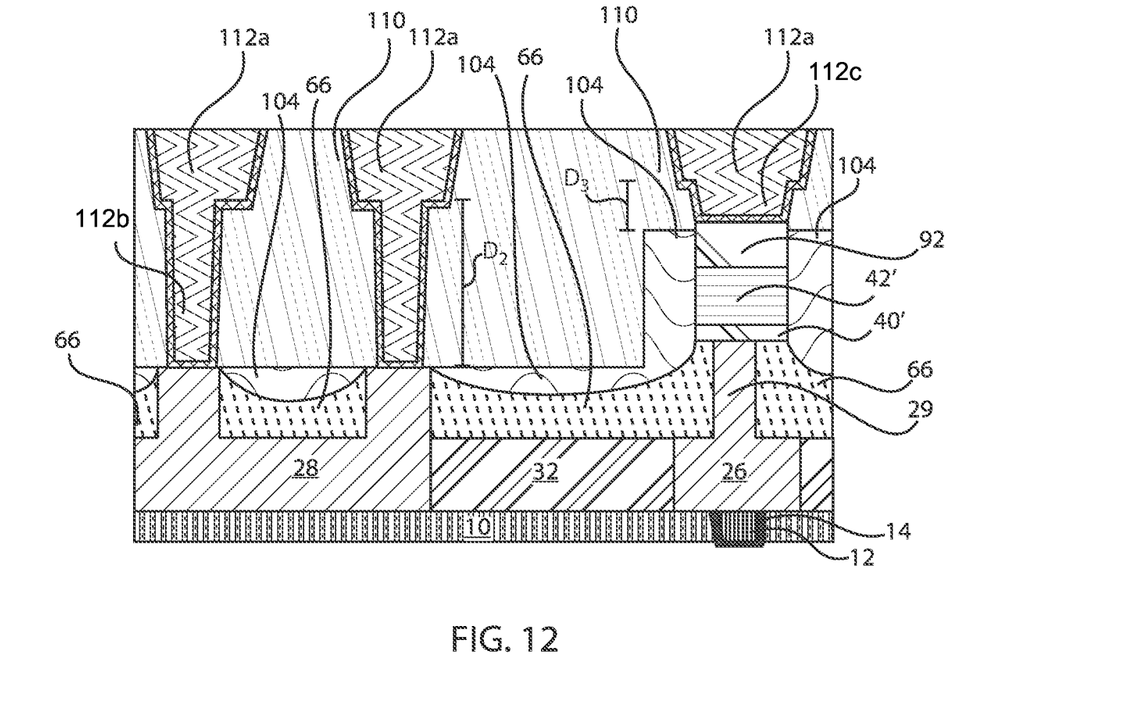
FIG. 12 is a cross-sectional view of the semiconductor structure of FIG. 11 where metal contacts are formed in direct contact with the conductive line and over the conductive pad, in accordance with an embodiment of the present invention.

FIG. 12 is a cross-sectional view of the semiconductor structure of FIG. 11 where metal contacts are formed in direct contact with the conductive line and over the conductive pad, in accordance with an embodiment of the present invention.

In various example embodiments, metal line 112a and vias 112b, 112c are formed using conventional dual damascene process. In the logic region, vias 112b extend from the bottom of metal line 112a to the top surface 27 of the top via 29' above conductive line portion 28 and in the memory region, vias 112c extends from the bottom of metal line 112a to the top surface 93 of the top electrode portion 92. The metal lines 112a and vias 112b, 112c are then filled with a conductive material 112. A distance between the top surface 27 of top via 29' above the conductive line portion 28 and the top of the vias 112b is designated as "$D_2$." A distance between the top surface 93 of the top electrode portion 92 and the top of the via 112c is designated as "$D_3$."

Therefore, the bottom electrode contact is self-aligned with the metal pad underneath. Additionally, a shallower logic area contact is formed which reduces the aspect ratio for the contact metal fill. In other words, the conductive line portion 28 reduces the length of vias in the logic area (left-hand side). Stated differently, vias 112b do not need to extend further into the structure because the addition of the top via 29' above conductive line portion 28 prevents such extension. Thus, vias 112b only need to extend a distance $D_2$. Additionally, with regard to the alternative embodiments of FIGS. 9-12, a thinner top electrode portion 92 can be employed while connecting top metal line 112*a* to the top electrode 92 using via 112*b* in the memory area (right-hand side). This allows embedding an MRAM device of shorter height between metal pad 26 and top metal lines 112*a*. The distance $D_3$ between the thin top electrode portion 92 and the top portion of the via allows enabling the use of thinner material options for the top electrode portion 92. Moreover, there is no bottom electrode footing or metal residue on sidewalls of the MTJ 42' since longer ion beam etching (IBE) over etch and clean-up can be employed without the risk of exposing and damaging metal lines 28 during IBE.

The conductive material 112 can include copper (Cu), cobalt (Co), aluminum (Al), platinum (Pt), gold (Au), tungsten (W), titanium (Ti), or any combination thereof. The metal 112 can be deposited by a suitable deposition process, for example, CVD, PECVD, PVD, plating, thermal or e-beam evaporation, or sputtering.

In various exemplary embodiments, the height of the conductive material 112 can be reduced by CMP and/or etching.

In conclusion, a method of forming an embedded MRAM device is presented where a bottom electrode contact employs a top via scheme where subtractive etching is used to form a contact (microstud) on top of the metal pads (e.g., Ru lines) in memory areas and a top via above metal lines in the logic areas. This allows BEC to be taller or thicker. Then memory device patterning is performed to form MRAM pillars in the memory area while exposing the top via in the logic area, which acts as a landing pad for next metal level via. Memory pillars are then encapsulated using a dielectric (e.g., SiN or SiCN:H) and encapsulation etch back is performed to expose the memory top electrode. Subsequently, an ILD is deposited and a top metal layer with via is formed. In one example embodiment, memory top electrodes are connected to metal lines and vias land on top vias in the logic area. In another example embodiment, both logic areas and MRAM areas employ the via to make electrical contact with the top metal lines. The structure of forming in-situ encapsulation of a reliable MRAM includes a bottom electrode contact that is tall with thick dielectric around it, a top contact in the logic area landing on the top via, a memory top electrode connected to a top metal with or without a contact, and a thick dielectric around the BEC and in the logic area to withstand IBE.

Regarding FIGS. 1-12, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for embedded MRAM integration with a BEOL interconnect structure including a top via (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for preventing excessive cap dielectric loss in memory areas and logic areas of a device, the method comprising:
   forming a U-shaped conductive line and a conductive pad in direct contact with a dielectric layer, wherein the conductive line defines dual top vias and the conductive pad includes a microstud, and wherein an entire bottom surface of the U-shaped conductive line directly contacts a top surface of the dielectric layer;
   depositing a dielectric cap in direct contact with a top surface of the U-shaped conductive line defined between the dual top vias, and with a portion of a top surface of the conductive pad; and
   constructing a top electrode, a magnetic tunnel junction (MTJ) stack, and a bottom electrode in vertical alignment with the microstud of the conductive pad.

2. The method of claim 1, further comprising depositing an encapsulation layer.

3. The method of claim 2, further comprising recessing the encapsulation layer to expose an upper area of the top electrode.

4. The method of claim 3, further comprising depositing an inter-layer dielectric (ILD).

5. The method of claim 4, further comprising forming first top metal lines with a first set of vias connecting to the top via above the U-shaped conductive line and a second top metal line connecting to the top electrode, wherein the first top metal lines with the first set of vias and the second top metal line are filled with a conductive material.

6. The method of claim 5, wherein the U-shaped conductive line with the top via reduces a length of the first set of vias, and thicker dielectric above the U-shaped conductive line and the conductive pad prevents excess gouging of the dielectric cap.

7. The method of claim 1, wherein the U-shaped conductive line is vertically offset from the conductive pad.

8. The method of claim 1, wherein the conductive pad with the microstud has a substantially inverted T-shaped configuration.

9. The method of claim 1, wherein the microstud of the conductive pad directly contacts the bottom electrode.

10. The method of claim 1, wherein the U-shaped conductive line and the conductive pad include ruthenium (Ru).

11. A method for reducing gouging of a dielectric cap by employing a subtractive etch technique forming a top via, the method comprising:
   forming a U-shaped conductive line defining dual top vias in a logic area of a device, wherein an entire bottom surface of the U-shaped conductive line directly contacts a top surface of a dielectric layer;
   forming a conductive pad with a microstud in a memory area of the device;
   depositing a dielectric cap in direct contact with a top surface of the U-shaped conductive line defined between the dual top vias, and with a portion of a top surface of the conductive pad;
   constructing MRAM pillars in the memory area, wherein the MRAM pillars are in direct contact with the microstud above the conductive pad;
   encapsulating the MRAM pillars with an encapsulation layer;

recessing the encapsulation layer to expose an upper area of the MRAM pillars; and forming metal lines to a top section of the MRAM pillars and metal lines with vias to a top surface of the top via above the U-shaped conductive line.

12. The method of claim 11, wherein each of the MRAM pillars includes a top electrode, a magnetic tunnel junction (MTJ) stack, and a bottom electrode.

13. The method of claim 12, wherein the U-shaped conductive line is vertically offset from the conductive pad.

14. The method of claim 13, wherein the conductive pad with the microstud has a substantially inverted T-shaped configuration.

15. The method of claim 11, wherein the microstud of the conductive pad directly contacts a bottom electrode.

16. The method of claim 11, wherein the U-shaped conductive line and the conductive pad include ruthenium (Ru).

* * * * *